(12) United States Patent
Issakov et al.

(10) Patent No.: US 9,526,163 B2
(45) Date of Patent: Dec. 20, 2016

(54) DEVICE AND METHOD FOR CROSSTALK REDUCTION IN TRANSMISSION LINES

(71) Applicant: Intel IP Corporation, Santa Clara, CA (US)

(72) Inventors: Vadim Issakov, Duesseldorf (DE); Werner Schelmbauer, Steyr (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/645,116

(22) Filed: Mar. 11, 2015

(65) Prior Publication Data

US 2016/0270212 A1  Sep. 15, 2016

(51) Int. Cl.
*H04B 1/40* (2015.01)
*H05K 1/02* (2006.01)
*H01P 3/08* (2006.01)
*H01P 5/08* (2006.01)

(52) U.S. Cl.
CPC .............. *H05K 1/0216* (2013.01); *H01P 3/08* (2013.01); *H01P 5/08* (2013.01); *H04B 1/40* (2013.01); *H05K 1/0237* (2013.01)

(58) Field of Classification Search
CPC .................. H01L 2924/0002; H01L 2924/00; H01L 23/5225; H01L 23/5223; H01L 23/552; H01L 23/5227; H01L 2924/3011; H01L 2224/73204; H01L 2924/00014; H01L 2924/13091; H01L 2224/16225; H01Q 15/0086; H01Q 9/0407; H01Q 1/243; H01Q 1/38; H01Q 15/006; H01Q 5/30; H01Q 5/335; H01Q 9/0428

See application file for complete search history.

(56) References Cited

U.S. PATENT DOCUMENTS

| | | | | |
|---|---|---|---|---|
| 2009/0102740 A1* | 4/2009 | Rofougaran | ............ | H01L 23/66 343/860 |
| 2010/0307798 A1* | 12/2010 | Izadian | ................... | H01L 24/24 174/255 |
| 2012/0104575 A1* | 5/2012 | Lin | ...................... | H01L 23/5225 257/664 |
| 2014/0341581 A1* | 11/2014 | Lent | ......................... | H04B 3/32 398/79 |

* cited by examiner

*Primary Examiner* — Golam Sorowar
(74) *Attorney, Agent, or Firm* — Schwegman Lundberg & Woessner, P.A.

(57) ABSTRACT

A system and method is provided for crosstalk reduction in a coupled transmission line on a multilayer structure. The coupled transmission line provides a high frequency signal such as from a local oscillator to an electronic component such as a mixer. The signal carried by the coupled transmission line may be buffered and asymmetrically tapped. The coupled transmission line may have individual parallel lines extending in the direction of current flow. The lines may carry current in opposite directions. Each line contains strips and/or is disposed on a different metallization layer. Strips on each metallization layer (before being routed to another metallization layer) may carry current in opposite directions and overlying strips on different metallization layers may carry current in opposite directions. Multiple strips of an individual line present on a single metallization layer may be disposed symmetrically around a centerline of the coupled transmission line.

22 Claims, 7 Drawing Sheets

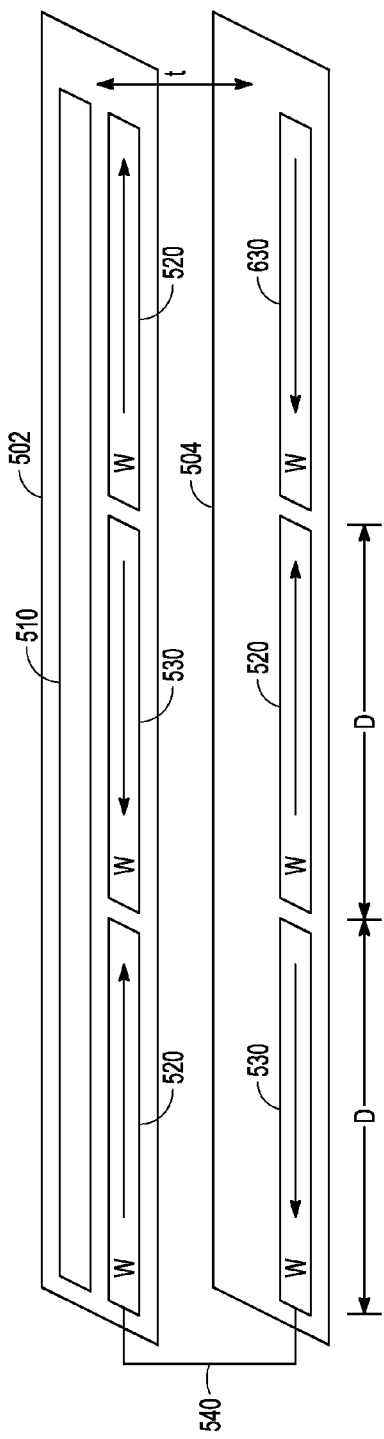
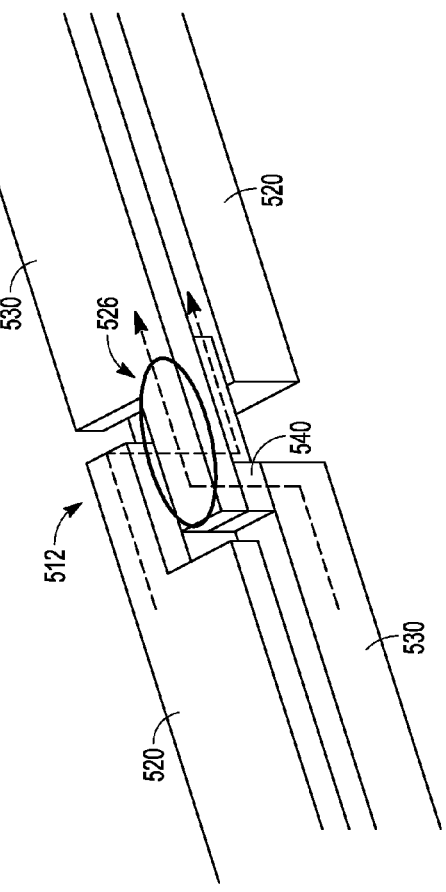
FIG. 5A
FIG. 5B

DEVICE AND METHOD FOR CROSSTALK REDUCTION IN TRANSMISSION LINES

BACKGROUND

With the ever increasing desire for faster data rates, notably through long-term evolution (LTE) networks, system designers have turned to carrier aggregation. Carrier aggregation increases bandwidth, and thus bitrate, by using multiple carriers to form a larger overall transmission bandwidth. The channels (frequency ranges) of the carriers can either be adjacent or separated by a substantial distance, e.g., being in different frequency bands. The use of carrier aggregation, however, has considerably increased transceiver complexity not only does the transceiver have to generate multiple independent buffered local oscillator (LO) signals, the buffered LO signals also have to be routed to the appropriate transceiver components, thereby increasing the length of the transmission lines carrying the LO signals as well as the routing complexity and density of transmission lines. The LO signals are used by the transceiver to upconvert and downconvert received RF signals to baseband for processing.

Besides problems in fabricating the transceiver due to the complicated routing, the increased routing length further leads to an increase of power consumption by the buffers. Both the increased signal power as well as density substantially increases the crosstalk between the channels. As is known, crosstalk may be caused by undesired capacitive, inductive, or conductive coupling between signal lines in circuitry that results in one or more frequencies present in one signal line appearing as noise in another signal line. In addition to increased signal power and line density, with the wide range of channels being used, an enhanced frequency range of the RF and LO signals is present in the transmissions lines. Buffers with faster slopes are thus used to accommodate the higher frequencies, resulting in increased noise at the baseband from higher order coefficients during mixing to downconvert the received RF signals. The increased coupling between transmission lines causes an undesirable amount of noise in the transceiver, resulting in increased baseband noise which degrades the signal to noise ratio (SNR) of the received RF signals.

It would be therefore desirable to reduce coupling between transmission lines within a chip or in a printed circuit board (PCB), notably in transceivers configured to operate in cellular networks, such as LTE and LTE-A networks using multiple carrier aggregation.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIGS. 5A and 5B illustrate perspective views of a multilayer structure in accordance with some embodiments.

DETAILED DESCRIPTION OF THE INVENTION

Figure 1:
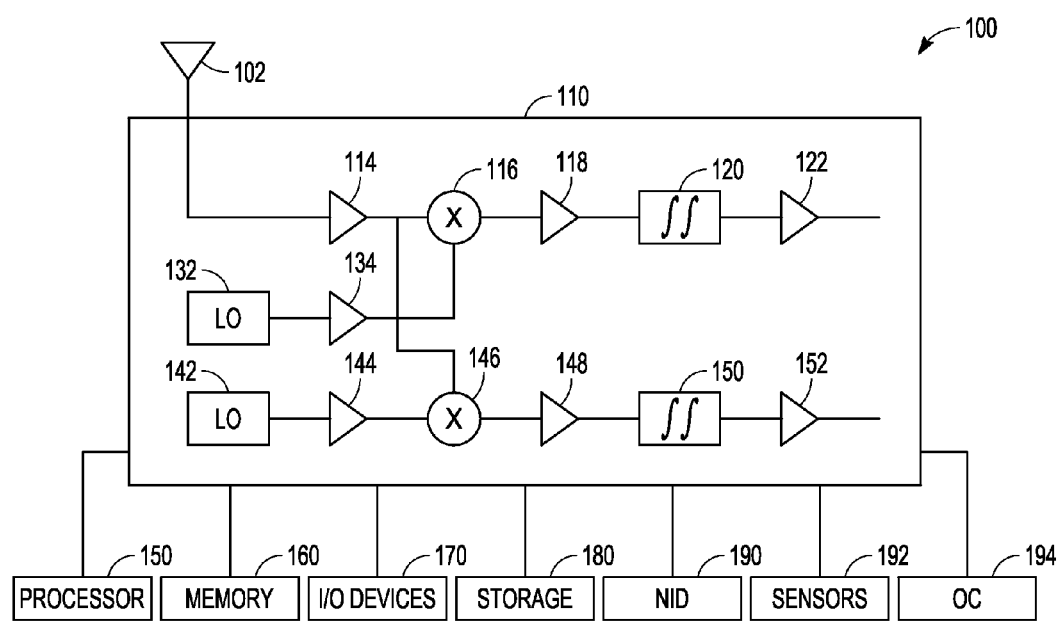
FIG. 1 is a block diagram illustrating user equipment (UE) in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments in this disclosure relate generally to reducing crosstalk in a coupled transmission line. Methods, systems, or devices disclosed herein may help in reducing the crosstalk between an aggressor line and the coupled transmission line routed over a relatively long distance (e.g., over 4 mm) at close vicinity (e.g. within about 10 µm) within a chip or over 5 cm at 80 µm on a printed circuit board (PCB) containing components such as a transceiver.

In one embodiment, a coupled transmission line may be provided on a multilayer structure, such as a chip or a PCB. The coupled transmission line provides a local oscillator (LO) signal from a local oscillator to at least one electronic component. The electric component may be, for example, a mixer or other component. The multilayer structure may include a transceiver and/or other devices. The coupled transmission line has a plurality of individual lines extending in parallel in a direction of current flow and configured to carry current in opposite directions. In various embodiments, the individual lines in the coupled transmission line may have a plurality of strips and/or may be disposed on different metallization layers of the multilayer structure. In the former embodiment in which the coupled transmission line contains a plurality of strips, the coupled transmission line may be configured to reduce crosstalk from a first aggressor line extending in parallel with the coupled transmission line as compared with a second coupled transmission line having a plurality of individual lines without the plurality of strips. In this case, the aggressor line may be disposed the same distance from the centerline of the coupled transmission line as the centerline of the second coupled transmission line. A total width of each set of the plurality of strips forming one of the individual lines may be the same as a width of the corresponding individual line of the second coupled transmission line. In the latter case in which the coupled transmission line may be disposed on different metallization layers, the coupled transmission line may be configured to reduce crosstalk from the aggressor line as compared with a coupled transmission line having a plurality of individual lines formed on a single metallization layer. The aggressor line may be disposed a same distance from the centerline of the coupled transmission line as the centerline of the second coupled transmission line. A width of each individual line of the coupled transmission line may be the same as a width of the corresponding individual line of the second coupled transmission line.

FIG. 1 is a block diagram illustrating user equipment in accordance with some embodiments. The user equipment 100 may be, for example, a personal computer (PC), a tablet PC, a set-top box (STB), a personal digital assistant (PDA), a mobile telephone, a cellphone, a smart phone, a web appliance, a network router, switch or bridge, a medical device (e.g., a heart rate monitor, a blood pressure monitor, etc.), a wearable device, or any machine capable of executing instructions (sequential or otherwise) that specify actions to be taken by that machine. The user equipment 100 contains a transceiver 110, as well as other devices, some or all of which may communicate with each other via an interlink (e.g., bus) (not shown). These devices may include a hardware processor 150 (e.g., a central processing unit (CPU), a GPU, a hardware processor core, or any combination thereof), a memory 160 (including dynamic and/or a static memory), input/output (I/O) devices 170 (including a display, a microphone, speaker, mouse and keyboard. for example), a storage device (e.g., drive unit) 180, a network interface device (NID) 190 (of which antenna 102 may be a part), sensors 192 (such as a global positioning system (GPS) sensor, compass, accelerometer, or other sensor), an output controller 194, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 180 may include a machine readable medium (not shown) on which may be stored one or more sets of data structures or instructions (e.g., software) embodying or utilized by any one or more of the techniques or functions described herein. The instructions may also reside, completely or at least partially, within the memory 160 or within the hardware processor 150 during execution thereof by the user equipment 100. In an example, one or any combination of the hardware processor 150, the memory 160, or the storage device 180 may constitute machine readable media. The machine readable medium may a single medium, the term "machine readable medium" may include a single medium or multiple media (e.g., a centralized or distributed database, and/or associated caches and servers) configured to store the one or more instructions. The term "machine readable medium" may include any medium that may be capable of storing, encoding, or carrying instructions for execution by the user equipment 100 and that cause the user equipment 100 to perform any one or more of the techniques of the present disclosure, or that may be capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 190 may include one or more physical jacks (e.g., Ethernet, coaxial, or phone jacks) or one or more antennas to connect to the communications network. In an example, the network interface device 190 may include a plurality of antennas to wirelessly communicate using at least one of single-input multiple-output (SIMO), multiple-input multiple-output (MIMO), or multiple-input single-output (MISO) techniques. In some examples, the network interface device 190 may wirelessly communicate using Multiple User MIMO techniques. The term "transmission medium" shall be taken to include any intangible medium that is capable of storing, encoding or carrying instructions for execution by the user equipment 100, and includes digital or analog communications signals or other intangible medium to facilitate communication of such software.

As shown in the embodiment of FIG. 1, the transceiver 110 may include a number of components, including local oscillators 132, 134, amplifiers 114, 118, 134, 122, 144, 152 filters 120, 150 and mixers 116, 146. The amplifiers 114, 118, 134, 122, 144, 152 may be fixed gain (e.g., buffers) or adjustable gain amplifiers. Other components, such as other filters (e.g., a surface acoustic wave (SAW) filter), mixers or buffers, may be present but are not shown for clarity. As shown, a radio frequency (RF) signal may be received by the antenna 102 of the user equipment 100. The RF signal, in one example, may be received from a fourth generation long-term evolution (4G LTE) network (not shown), such as from a base station (or eNodeB). The RF signal may be a multiple carrier-aggregated signal that has carriers from different bands. The RF signal may be amplified by amplifier 114 before being provided to mixer 116. The output of the mixer 116 may be provided to amplifier 118 before being filtered by filter 120 and subsequently provided to another amplifier 122 before being provided to other components (not shown) such as an analog-to-digital converter (ADC). A first LO signal from a first local oscillator 132 (formed for example by a phase-locked loop) may be provided to a first LO buffer 134. Similarly a second LO signal from a second local oscillator 142 may be provided to a second LO buffer 144. The buffered first and second LO signals from first and second buffers 134, 144 may be respectively provided to mixers 116, 146, where they may be used to mix the buffered RF signals from amplifier 114 down to baseband. The output of the mixer 146 may be provided to amplifier 148 before being filtered by filter 150. The amplified 148 downconverted signal may be subsequently provided to another amplifier 152 before being provided to the ADC. In other embodiments, only a single buffered LO signal may be used. Of course, other topological variations of the components shown in FIG. 1 are possible.

Figure 2:
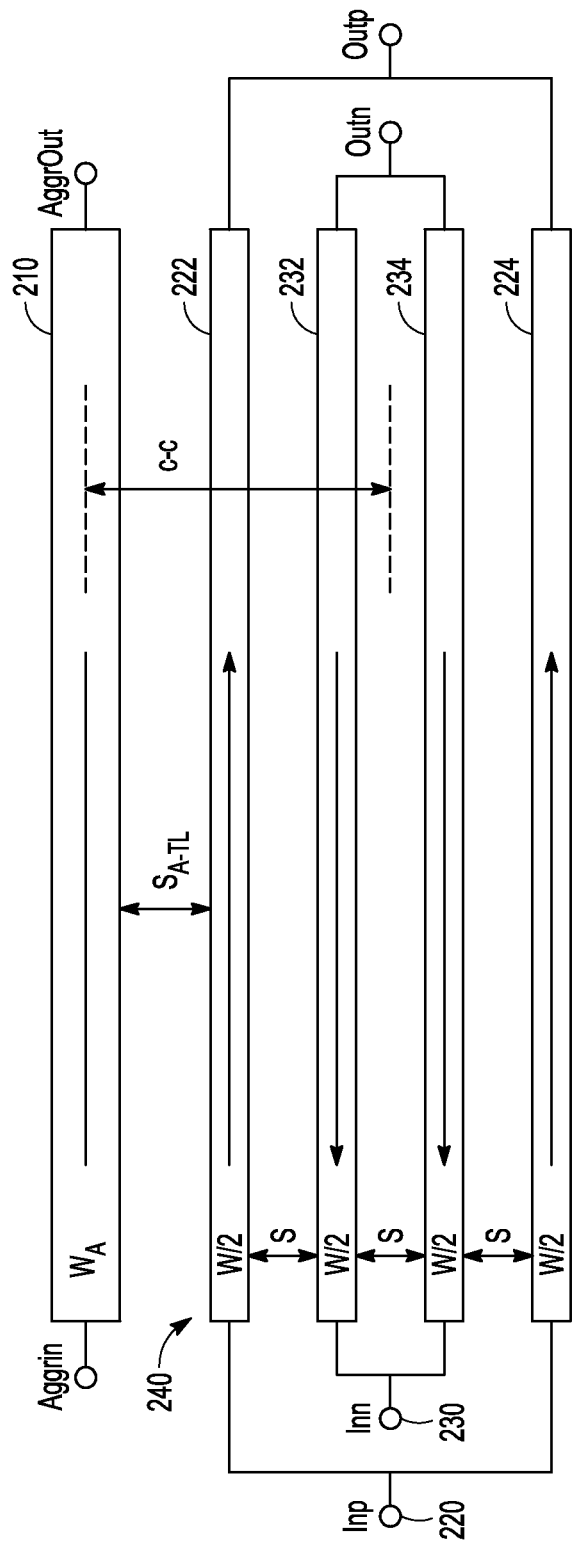
FIG. 2 illustrates a top view of a layer in a multilayer structure in accordance with some embodiments.

As above, the components shown in FIG. 1 may be fabricated, in various embodiments, on a multilayer structure, such as semiconductor chip or a PCB. FIG. 2 illustrates a top view of a layer in a multilayer structure in accordance with some embodiments. In the portion of the layer shown in FIG. 2, two signal lines are shown, an aggressor line 210 of width $W_A$ separated from a coupled transmission line 240 occupying a lateral space of 2W+3s by distance $s_{A\text{-}TL}$. The coupled transmission line 240 may carry desired signals, such as one of the buffered LO signals described in reference to FIG. 1. The aggressor line 210, due to the line density (and signal power on the aggressor line 210), may undesirably couple with coupled transmission line 240. This is to say that the aggressor line 210 may carry signals that introduce noise onto the coupled transmission line 240. The aggressor line 210 and coupled transmission line 240 may extend in the direction of current flow, which is shown in FIG. 2 as horizontally, so that the current may flow in aggressor line 210 in the direction of AggrIn to AggrOut and in the signal lines from Inp to Outp and from Outn to Inn. The coupled transmission line 240 extends a substantial distance (e.g., several mm, such as 5 mm) for coupling to occur and countermeasures to be effective.

As can be seen, the coupled transmission line 240 contains a plurality of individual lines 220, 230. The individual lines 220, 230 may carry current in opposite directions, forming a differential signal. Each line 220, 230 similarly may contain a plurality of strips 222, 224, 232, 234, with each strip of a particular individual line carrying current in the same direction. The coupled transmission line 240 and aggressor line 210 may be separated by a center-to-center distance. As shown, the centerline (in the direction of current flow) of the aggressor line 210 and the centerline of the coupled transmission line 240 is shown as c-c in FIG. 2. Although only two individual lines and strips are shown, the number of individual lines and/or strips may vary dependent on the embodiment. Each line 220, 230 may have a width W, which may be in one embodiment uniformly divided among the strips such that each strip 222, 224, 232, 234 may have a width of W/n (as shown in FIG. 2, W/2). The width of the lines equal in one embodiment as narrower lines may exhibit higher resistive losses due to having a smaller cross-section as well as increased skin effect losses, have a higher impedance and in general may be more difficult to match, although an increased number of strips provides a finer granularity of coupling between the strips and the aggressor line. Each strip 222, 224, 232, 234 may be separated from adjacent strips by a uniform separation s. In other embodiments, one or more of the lines may not be split uniformly such that the strips may not have the same width. Similarly, the strips may not have the same separation therebetween.

Typically, a coupled transmission line may contain only individual lines (i.e., without strips) of width W. However, the use of a typical coupled transmission line may introduce problems simply due to geometrical issues. More specifically, as electromagnetic coupling between lines may be proportional to the distance between the lines, coupling between the aggressor line and the nearer line may be larger than between the aggressor line and the farther individual line. This may cause more noise to be introduced to the nearer line than the farther line and thus serve to create an imbalance between the lines. To combat this effect, as shown in FIG. 2, the individual lines may be split into strips. The strips 222, 224, 232, 234 may be arranged such that strips 222, 224; 232, 234 carrying current in the same direction may be symmetric around the centerline of the coupled transmission line 240. Thus, strips 232, 234 forming one of the individual lines 230 may be disposed within strips 222, 224 forming the other of the individual lines 220. As shown, input terminals of the strips 222, 224, 232, 234 may be such that the two inner strips 232, 234 may carry in-phase signals, whereas the two outer strips 222, 224 may carry in-phase signals 180° shifted compared to the inner strips 232, 234.

As shown, the distance between the aggressor line 210 and the strips 222, 224, 232, 234 may be thus $W_A/2+s_{A\text{-}TL}+W/4$, $W_A/2+s_{A\text{-}TL}+7W/4+3s$, $W_A/2+s_{A\text{-}TL}+3W/4+s$, $W_A/2+s_{A\text{-}TL}+5W/4+2s$, and respectively. Thus, the average distance between the aggressor line and the strips (i.e., each individual lines from which the strips may be formed) may be the same: $W_A/2+s_{A\text{-}TL}+W+3s/2$, which may be the distance between the centerlines, c-c. Accordingly, the magnitude of the coupled signal from the aggressor line 210 may be equal and, better canceling interference from the aggressor line 210 when the signal from the strips 222, 224, 232, 234 may be summed differentially. In contrast, the average distance between the aggressor line and the individual lines in the typical coupled transmission line may be different, $W_A/2+s_{A\text{-}TL}+W/2$ and $W_A/2+s_{A\text{-}TL}+3W/2+s$ respectively.

The strips of the same line may be summed at the outputs by combining the strips using a T-junction, or tapered connection for higher frequencies. The outputs may thus contain differential signals from the individual lines 220, 230 and common-mode signals from the aggressor line 210. Mathematically, the interference provided by the aggressor line 210 on the coupled transmission line 240 is $A_1 e^{j\Phi_1} - A_2 e^{j\Phi_2}$ where $A_1$ and $A_2$ are the magnitudes and $\phi_1$ and $\phi_2$ are the phases of the noise on the individual lines at the outputs. As the phase difference $\phi_1$, $\phi_2$ between the signals from the aggressor line 210 present at the outputs of the individual lines 220, 230 may be the same, the smaller the magnitude imbalance $(A_2/A_1)$, the smaller the noise. The signals from the individual lines, however, may be out of phase. The use of differential signals may be thus able to suppress coupled noise as the asymmetry of the signals from the aggressor line 210 may be reduced. Note that the phase imbalance of the signals on the individual lines present at the input of the above structure (where the lines may be split into strips) may be essentially the same as that at the output of the individual lines (where the strips may be rejoined to the original lines). Other embodiments may include arrangements in which the phase relationships between the differential signals on the individual lines may be maintained from input to output but the absolute phases may be adjusted.

Figure 3:
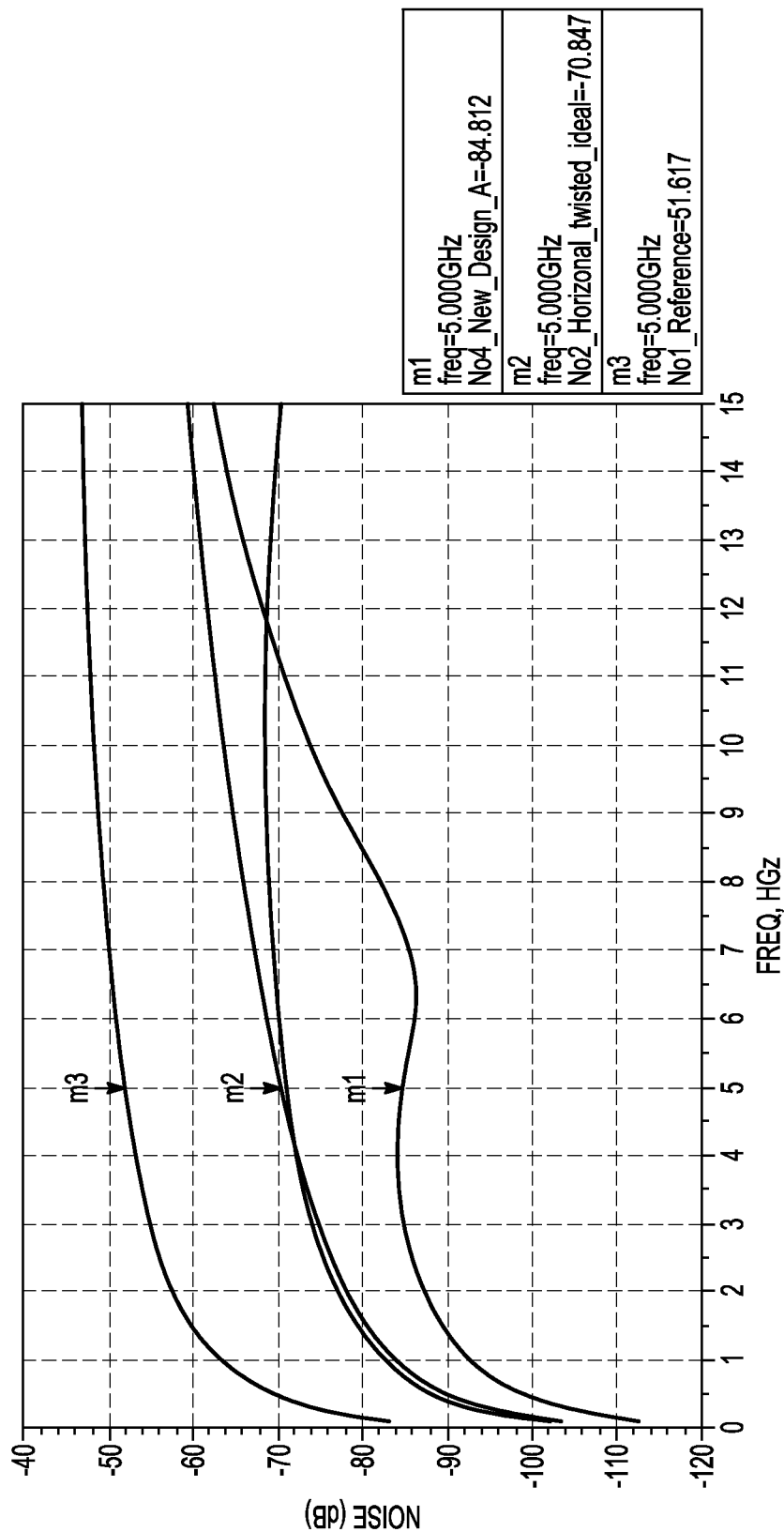
FIG. 3 illustrates a graph of crosstalk in different arrangements including an arrangement in accordance with some embodiments.

FIG. 3 illustrates a graph of crosstalk in different arrangements including an arrangement in accordance with some embodiments. The graph shows several simulated plots of an aggressor line extending in parallel with a coupled transmission line for 1 mm. The greatest amount of crosstalk occurs, predictably, when no countermeasures are taken, as shown by the plot labeled m3. An arrangement in which the individual lines are symmetrically twisted (i.e., the lines exchange positions relative to the aggressor line perfectly periodically) is shown by the plot labeled m2. As can be seen, the crosstalk in m2 is reduced 20 dB at 5 GHz compared with m3. Adding asymmetries to the ideally twisted lines so that they are no longer symmetrically twisted reflects real world conditions including due to non-even distribution of connections to (tapping of) the coupled transmission line. This results in the plot m2 being shifted to form plot m2' so that crosstalk increases relatively at higher frequencies, increasing 10 dB at 15 GHz. Splitting the individual lines, as shown in FIG. 2, results in the plot m1, in which an enhanced crosstalk rejection is present at frequencies below about 12 GHz, reducing the crosstalk 33 dB at 5 GHz compared with m3 and 14 dB compared with m2. However, at higher frequencies, resistive and other effects become more prevalent, causing the noise rejection to decrease at frequencies significantly over 7 GHz. In particular, as shown, at frequencies of about 12 GHz and above, noise in the arrangement shown in FIG. 2 is worse than the ideal case shown in m2 but still about 4 dB below the non-ideal case m2'. To combat this effect at higher frequencies, other arrangements may be provided.

Figure 4:
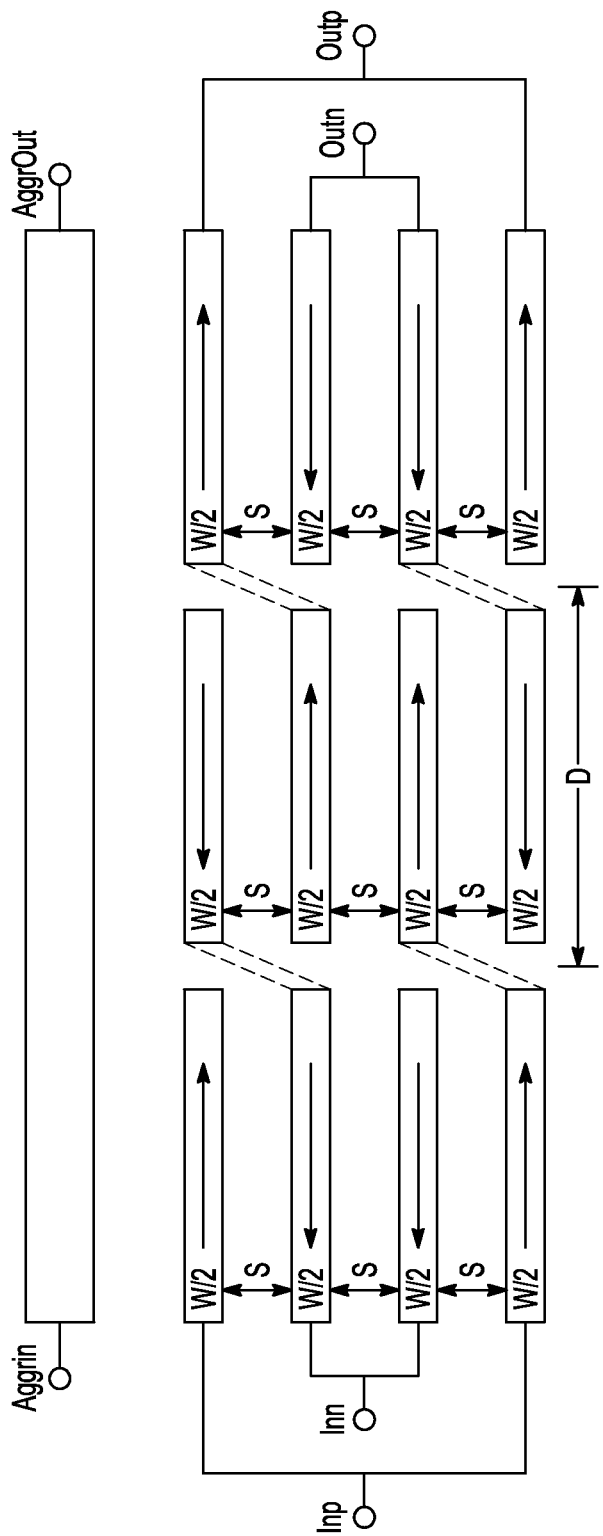
FIG. 4 illustrates a top view of a layer in a multilayer structure in accordance with some embodiments.

FIG. 4 illustrates a top view of a layer in a multilayer structure in accordance with some embodiments. This embodiment differs from the embodiment shown in FIG. 2 in that pairs of adjacent strips of different lines exchange positions as the coupled transmission line extends in the direction of current flow. As shown, the strips exchange positions symmetrically, every distance D in the direction of current flow. Each of the strips exchanges positions with the corresponding adjacent strip of the other line at the same location in the direction of current flow. To enable exchange, some of the strips may exchange locations through traces only on the same metallization layer as the aggressor line and the majority of the coupled transmission line (as shown by the dashed lines in FIG. 4), while others may use a different metallization layer accessed through vias in one or more insulating layers between the metallization layers.

FIGS. 5A and 5B illustrate perspective views of a multilayer structure in accordance with some embodiments. Rather than suppressing the aggressor line by using strips as in FIG. 2, the arrangement of FIGS. 5A and 5B may use vertical signal routing. In the portion of the layer shown in FIG. 5A, an aggressor line 510 may be separated on the same metallization layer from a coupled transmission line 540. The coupled transmission line 540, like the arrangements of FIGS. 2 and 4, may contain a plurality of individual lines 520, 530 that carry current in opposite directions. However, in this embodiment, the individual lines 520, 530 may be laterally equidistant from the aggressor line 510 and none of the individual lines 520, 530 may contain a plurality of strips. This may allow the individual lines to be the same width as in the arrangement of FIG. 2 but take up less overall width as separation between strips is not present. Like the above embodiments, although only two individual lines are shown, the number of individual lines may vary dependent on the embodiment. Each line 520, 530 may have a width W. As shown, the individual lines 520, 530 overlay each other. In other words, one of the lines 520 may be disposed on one metallization layer 502 while another of the lines 530 may be disposed on another metallization layer 504 at the same position in the direction perpendicular to the metallization layers 502, 504. The metallization layers 502, 504 may be separated by at least one insulating layer 540 of thickness t (e.g., >2 μm on a chip and typically 50-100 μm on a PCB), shown in FIG. 5B.

As one of the lines may be disposed on the metallization layer with the aggressor line 510 while another of the lines may be disposed on another metallization layer, the individual lines 520, 530 may be not entirely equidistant from the aggressor line 510. The aggressor line 510 may couple to the line disposed on the metallization layer more strongly due in part to the reduced distance and in part to the insulator layer 540 between the metallization layers 502, 504. To balance the coupling, each line 520, 530 may make a vertical crossover, i.e., may be routed from the metallization layer 502, 504 on which it may be disposed to the opposite metallization layer 502, 504 at substantially the same location 512, as shown in FIG. 5B. Each line 520, 530 connects to the opposite metallization layer 502, 504 through a via 512, with the vias for the different lines 520, 530 being adjacent to each other so that the lines 520, 530 may be contiguous on both metallization layers 502, 504. As shown, a finger 526 of each line 520, 530 of smaller width (e.g., W/3) may extend from the line through the associated via 512 to the other metallization layer 502, 504, with a predetermined width (e.g., W/3) between the fingers 526. The vertical crossovers may occur periodically, separated by distance D. To ensure symmetry, the number of crossovers may be odd, so that each line 520, 530 may be on the same metallization layer 502, 504 for the same distance as the other line 520, 530.

Figure 6:
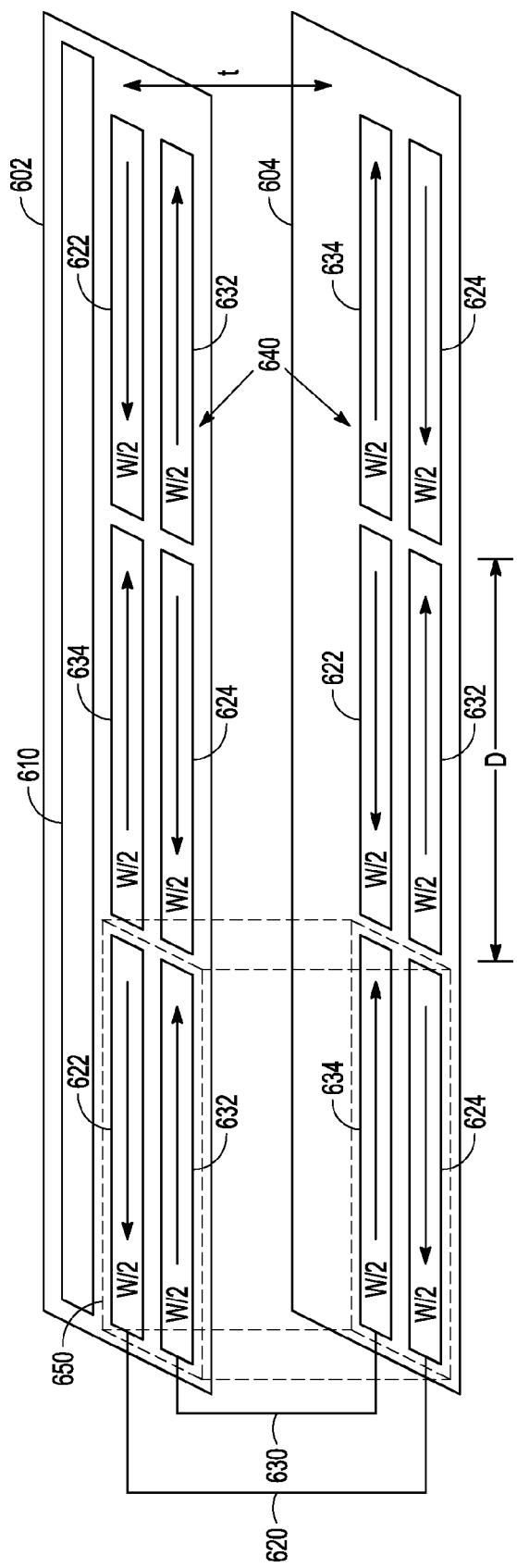
FIG. 6 illustrates a perspective view of a multilayer structure in accordance with some embodiments.

FIG. 6 illustrates a perspective view of a multilayer structure in accordance with some embodiments. This embodiment combines the embodiments shown in FIGS. 2 and 5A and 5B. In the portion of the layer shown in FIG. 6A, an aggressor line 610 may be separated on the same metallization layer from a coupled transmission line 640. The coupled transmission line 640, like the arrangements of FIGS. 2 and 4, may contain a plurality of individual lines 620, 630 that may carry current in opposite directions. In this embodiment, the individual lines 620, 630 may be laterally equidistant from the aggressor line 610 and contain a plurality of strips 622, 624, 632, 634. As above, although only two individual lines and strips may be shown, the number of individual lines and/or strips may vary. Each line 620, 630 may have a width W and strip may have width W/n (as shown W/2). The individual lines 620, 630 and strips 622, 624, 632, 634 may overlay each other such that the strips 622, 624 of one of the lines 620 may be disposed on different metallization layers 602, 604 and the strips 632, 634 of another of the lines 630 may be disposed on different metallization layers 602, 604. The metallization layers 602, 604 may be separated by at least one insulating layer of thickness t (e.g., >2 μm).

For convenience of discussion, a unit 650 may be shown as the portion of the coupled transmission line 650 over which the strips 622, 624, 632, 634 of the individual lines 620, 630 may be not routed to the opposite metallization layers 602, 604. The unit 650 thus may extend for distance D in the direction of current flow. As shown, the strips 622, 632 disposed on one of the metallization layers 602 in unit 650 may overlay the strips 624, 634 on another of the metallization layers 604. The strips 622, 632; 624, 634 disposed on a particular metallization layer 602; 604 in unit 650 may carry current in different directions. Similarly, the overlaying strips 622, 634; 624, 632 in unit 650 may carry current in different directions.

As indicated above, to balance the coupling, each line 620, 630 in FIG. 6 may make a vertical crossover, i.e., may be routed from the metallization layer 602, 604 on which it may be disposed to the opposite metallization layer 602, 604 at substantially the same location. Each line 620, 630 may connect to the opposite metallization layer 602, 604 through a via, with the vias for the different lines 620, 630 being adjacent to each other so that the lines 620, 630 may be contiguous on both metallization layers 602, 604. The vertical crossovers may occur periodically, separated by distance D. To ensure symmetry, the number of crossovers may be odd, so that each line 620, 630 may be on the same metallization layer 602, 604 for the same distance as the other line 620, 630. In other embodiments, the switch of positions of the lines may occur for each line at substantially the same point on along a metallization layer or may be staggered such that the lines switch at different points, for example, with the lines switching after distance D but being staggered by D/2. Moreover, in other embodiments, each line 620, 630 on the metallization layer 602, 604 may switch positions at the same place on the metallization layer and between metallization layers such that each line effectively switches diagonally.

Figure 7:
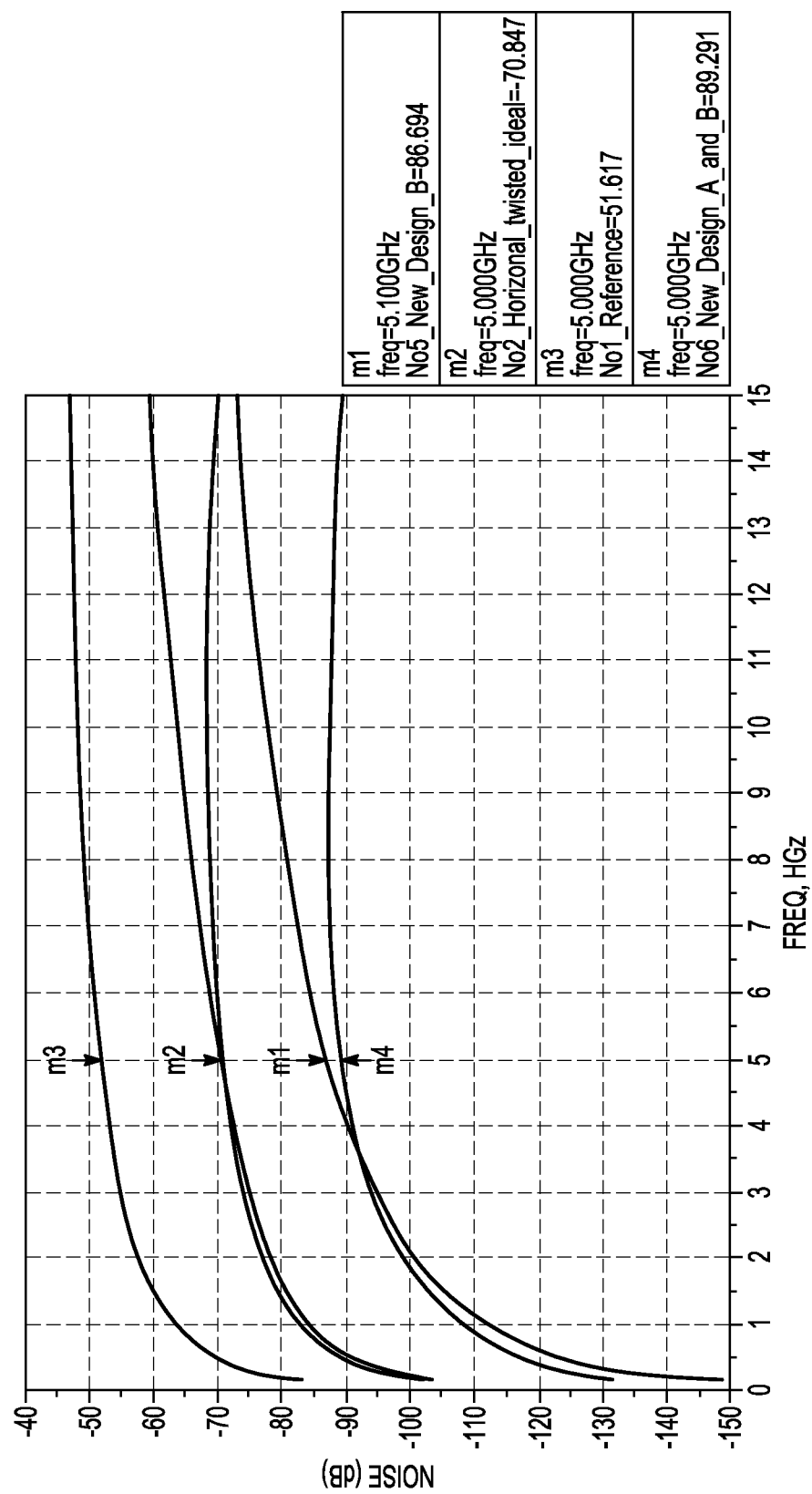
FIG. 7 illustrates a graph of crosstalk in different arrangements including an arrangement in accordance with some embodiments.

FIG. 7 illustrates a graph of crosstalk in different arrangements including an arrangement in accordance with some embodiments. The graph shows several simulated plots of an aggressor line extending in parallel with a coupled transmission line for 1 mm, including the embodiments shown in FIGS. 5A and 5B and FIG. 6. The plots for the embodiments shown in FIGS. 5A and 5B and FIG. 6 correspond to the worst case scenario of asymmetric tapping of the coupled transmission line. Similar to FIG. 3, an arrangement in which the coupled transmission line merely extends parallel with the aggressor line is shown by the plot labeled m3 and in which the individual lines are symmetrically twisted is shown by the plot labeled m2. The embodiment shown in FIGS. 5A and 5B is depicted by the line labeled m1 and results in an enhanced crosstalk rejection compared with m3 of about 35 dB at 5 GHz, about 16 dB compared with the ideal case m2 and 11 dB below the non-ideal case m2'. Significantly, the embodiment shown in FIGS. 5A and 5B remains below even the ideal case, m2, at all frequencies below 15 GHz, albeit the crosstalk rejection rises substantially linearly from 5 GHz to 15 GHz so that at 15 GHz it is 2 dB below the ideal case m2 and still about 25 dB below m3. The embodiment shown in FIG. 6 is depicted by the line labeled m4 and results in an enhanced crosstalk rejection compared with m3 of about 37 dB at 5 GHz and about 19 dB compared with m2. Significantly, the embodiment shown in FIGS. 5A and 5B remains below even the ideal case, m2, at all frequencies below 15 GHz, albeit the crosstalk rejection rises substantially linearly from 5 GHz to 15 GHz so that at 15 GHz it is 2-3 dB below the ideal case m2 and still about 25 dB below m3. Combining the arrangements shown in FIG. 2 and FIGS. 5A and 5B to provide the arrangement shown in FIG. 6 is depicted by the line labeled m4. By combining the various embodiments, the crosstalk reduction is again significantly reduced at all frequencies between 5 GHz and 15 GHz. Moreover, as shown by m4, the crosstalk reduction remains substantially constant at about 38 dB-42 dB below m3 over this frequency range, even though asymmetric tapping of the coupled transmission line is present. Thus, the embodiment shown in FIG. 6 results in a 30 dB reduction in crosstalk at 15 GHz compared with the embodiment shown in FIG. 2 and a 18 dB reduction in crosstalk at 15 GHz compared with the embodiment shown in FIGS. 5A and 5B.

Other embodiments are also possible. As mentioned above with respect to FIG. 2, the separation and/or widths of the strips may differ. Thus, for example, more than one strip of each line may be present on each metallization layer in the embodiment shown in FIG. 6. In another example, one line may be broken up into strips while the other line may not be, with the strips symmetrically disposed around the line. In addition, the periodicity of the strips may change in the direction of current flow. The metal(s) used on the different metallization layers may be different, leading to different metallization thicknesses on the layers (while the width of the strips on each metallization layer remains constant). These adjustments may be made to combat asymmetric tapping of the coupled transmission line that occurs throughout the transceiver.

Thus, in various embodiments a coupled transmission line is provided on a multilayer structure. The coupled transmission line provides a high frequency signal such as a local oscillator signal from a local oscillator to an electronic component such as a mixer. The signal carried by the coupled transmission line may be buffered and asymmetrically tapped. The coupled transmission line may have individual parallel lines extending in the direction of current flow. The lines carry current in opposite directions. Each line may be composed of strips and/or may be disposed on a different metallization layer. Thus, in certain embodiments, strips on each metallization layer (before being routed to another metallization layer) carry current in opposite directions and overlying strips on different metallization layers carry current in opposite directions. Moreover, multiple strips of an individual line present on a single metallization layer may be disposed symmetrically around a centerline of the coupled transmission line.

Although an embodiment has been described with reference to specific example embodiments, it will be evident that various modifications and changes may be made to these embodiments without departing from the broader spirit and scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A transceiver comprising:
a local oscillator configured to provide a local oscillator (LO) signal;
an electronic component configured to receive radio frequency (RF) signals and to use the LO signal to process the RF signals; and
a coupled transmission line configured to provide the LO signal from the local oscillator to the electronic component, wherein:
the coupled transmission line comprises a plurality of individual lines extending in parallel in a direction of current flow and configured to carry current in opposite directions such that a first individual line carries current in a first direction and a second individual line carries current in a second direction opposite the first direction,
each of the plurality of individual lines in the coupled transmission line comprises a plurality of strips,
a first plurality of strips of the first individual line carries current in the first direction and a second plurality of strips of the second individual line carries current in the second direction, and
the first plurality of strips is disposed within the second plurality of strips.

2. The transceiver of claim 1, wherein the plurality of strips of one of the individual lines is disposed within the plurality of strips of the other of the individual lines such that an average distance of the first plurality of strips from an aggressor line extending in parallel with the coupled transmission line and an average distance of the second plurality of strips from the aggressor line is equal.

3. The transceiver of claim 1, wherein the plurality of strips of the coupled transmission line are disposed on a single metallization layer of the transceiver.

4. The transceiver of claim 3, wherein adjacent strips of the plurality of strips are separated from one another by a uniform distance.

5. A transceiver, comprising:
a local oscillator configured to provide a local oscillator (LO) signal;
an electronic component configured to receive radio frequency (RF) signals and to use the LO signal to process the RF signals; and
a coupled transmission line configured to provide the LO signal from the local oscillator to the electronic component and disposed on multiple metallization layers separated in a direction perpendicular to a plane of each metallization layer, wherein:
the coupled transmission line comprises a plurality of individual lines extending in parallel in a direction of current flow and configured to carry current in opposite directions,
each of the plurality of individual lines of the coupled transmission line comprises a plurality of strips, and
the coupled transmission line is disposed on different metallization layers such that the individual lines on the different layers overlap each other in the perpendicular direction.

6. The transceiver of claim 5, wherein:
the strips of the coupled transmission line overlay each other on the different metallization layers,
the strips of the coupled transmission line on each metallization layer are configured to carry current in opposite directions, and
overlaying strips of the coupled transmission line on different metallization layers are configured to carry current in opposite directions.

7. The transceiver of claim 6, wherein, at a location in the direction of current flow, at least one of the strips on one of the metallization layers is routed to another of the metallization layers and the overlaying strip on the other of the metallization layers is routed to the one of the metallization layers.

8. The transceiver of claim 7, wherein, at substantially a same location in the direction of current flow, each of the strips on one of the metallization layers is routed to another of the metallization layers and the corresponding overlaying strip on the other of the metallization layers is routed to the one of the metallization layers.

9. The transceiver of claim 1, wherein each of the strips extends at least several mm in the direction of current flow.

10. A transceiver, comprising:
a local oscillator configured to provide a local oscillator (LO) signal;
an electronic component configured to receive radio frequency (RF) signals and to use the LO signal to process the RF signals; and
a coupled transmission line configured to provide the LO signal from the local oscillator to the electronic component, wherein:
the coupled transmission line comprises a plurality of individual lines extending in parallel in a direction of current flow and configured to carry current in opposite directions,
each of the plurality of individual lines in the coupled transmission line comprises a plurality of strips,
the coupled transmission line is configured to reduce crosstalk from an aggressor line extending in parallel with the coupled transmission line as compared with a second coupled transmission line comprising a second plurality of individual lines free from the plurality of strips,
the aggressor line is disposed a same distance from a centerline of the coupled transmission line as a centerline of the second coupled transmission line, and
a total width of each set of the plurality of strips forming one of the individual lines is the same as a width of the corresponding individual line of the second coupled transmission line.

11. User equipment comprising a transceiver, the transceiver comprising:
a local oscillator configured to provide a local oscillator (LO) signal;
an electronic component configured to receive radio frequency (RF) signals and to use the LO signal to process the RF signals; and
a coupled transmission line configured to provide the LO signal from the local oscillator to the electronic component, the coupled transmission line comprising a plurality of individual lines extending in parallel in a direction of current flow and disposed on different metallization layers separated in a direction perpendicular to a plane of each metallization layer such that the individual lines of the coupled transmission line overlay each other on the different metallization layers in the perpendicular direction, the plurality of individual lines of the coupled transmission line configured to carry current in an opposite direction, wherein:

the coupled transmission line is configured to reduce crosstalk from an aggressor line extending in parallel with the coupled transmission line as compared with a second coupled transmission line comprising a second plurality of individual lines formed on a single metallization layer, the aggressor line is disposed a same distance from a centerline of the coupled transmission line as a centerline of the second coupled transmission line, and a width of each individual line of the coupled transmission line is the same as a width of the corresponding individual line of the second coupled transmission line.

12. The user equipment of claim 11, wherein, at a location in the direction of current flow, the individual line on one of the metallization layers is routed to another of the metallization layers and the overlaying individual line on the other of the metallization layers is routed to the one of the metallization layers.

13. The user equipment of claim 12, wherein the user equipment further comprises an antenna coupled to the transceiver and configured to receive the RF signals and provide the RF signals to the electronic component, the RF signals including Long-Term Evolution (LTE) carrier-aggregated signals.

14. A method of reducing transmission line crosstalk in a circuit, the method comprising:

providing a coupled transmission line on a multilayer structure, the coupled transmission line configured to provide a local oscillator signal from a local oscillator to at least one electronic component, the coupled transmission line comprising a first plurality of individual lines extending in parallel in a direction of current flow and configured to carry current in an opposite direction, wherein at least one of:

the individual lines in the coupled transmission line at least one of:

each comprises a plurality of strips disposed such that the strips of one of the individual lines is disposed within the strips of another of the individual lines, or are disposed on different metallization layers separated in a direction perpendicular to a plane of each metallization layer, the coupled transmission line is configured to reduce crosstalk from a second aggressor line extending in parallel with the coupled transmission line as compared with a third coupled transmission line comprising a third plurality of individual lines formed on a single metallization layer, the aggressor line is disposed a same distance from a centerline of the coupled transmission line as a centerline of the third coupled transmission line, and a width of each individual line of the coupled transmission line is the same as a width of the corresponding individual line of the third coupled transmission line.

15. The method of claim 14, wherein all of the plurality of strips of the coupled transmission line are disposed on a single metallization layer.

16. The method of claim 14, wherein:

the individual lines of the coupled transmission line comprise a plurality of strips and are disposed on different metallization layers of the circuit, and the strips of the coupled transmission line overlay each other on the different metallization layers such that the strips of the coupled transmission line on each metallization layer are configured to carry current in opposite directions and overlaying strips of the coupled transmission line on different metallization layers are configured to carry current in opposite directions.

17. The method of claim 16, wherein, at substantially a same location in the direction of current flow, each of the strips on one of the metallization layers is routed to another of the metallization layers and the corresponding overlaying strip on the other of the metallization layers is routed to the one of the metallization layers.

18. The method of claim 14, wherein the individual lines of the coupled transmission line are disposed on different metallization layers and arranged such that the individual lines overlay each other on the different metallization layers.

19. The method of claim 14, wherein, at a location in the direction of current flow, the individual line on one of the metallization layers is routed to another of the metallization layers and the overlaying individual line on the other of the metallization layers is routed to the one of the metallization layers.

20. The method of claim 14, wherein at least one of:

a) the coupled transmission line comprises the plurality of strips, the coupled transmission line is configured to reduce crosstalk from a first aggressor line extending in parallel with the coupled transmission line as compared with a second coupled transmission line comprising a second plurality of individual lines free from the plurality of strips, the aggressor line is disposed a same distance from a centerline of the coupled transmission line as a centerline of the second coupled transmission line, and a total width of each set of the plurality of strips forming one of the individual lines is the same as a width of the corresponding individual line of the second coupled transmission line, and b) the coupled transmission line is disposed on the different metallization layers.

21. A transmission line structure comprising:

a coupled transmission line comprising a first plurality of individual lines extending in parallel in a direction of current flow and disposed on different metallization layers separated in a direction perpendicular to a plane of each metallization layer such that the individual lines of the coupled transmission line overlay each other on the different metallization layers, the first plurality of individual lines of the coupled transmission line configured to carry current in an opposite direction, the coupled transmission line is configured to reduce crosstalk from an aggressor line extending in parallel with the coupled transmission line as compared with a second coupled transmission line comprising a second plurality of individual lines formed on a single metallization layer, the aggressor line is disposed a same distance from a centerline of the coupled transmission line as a centerline of the second coupled transmission line, and a width of each individual line of the coupled transmission line is the same as a width of the corresponding individual line of the second coupled transmission line.

22. The transmission line structure of claim 21, wherein, at a location in the direction of current flow, an individual line on one of the metallization layers is routed to another of the metallization layers and the overlaying individual line on the other of the metallization layers is routed to the one of the metallization layers.

\* \* \* \* \*

UNITED STATES PATENT AND TRADEMARK OFFICE
CERTIFICATE OF CORRECTION

PATENT NO. : 9,526,163 B2
APPLICATION NO. : 14/645116
DATED : December 20, 2016
INVENTOR(S) : Issakov et al.

Page 1 of 2

It is certified that error appears in the above-identified patent and that said Letters Patent is hereby corrected as shown below:

In the Claims

In Column 11-12, in Claim 5-9, delete "5. A transceiver, comprising:
a local oscillator configured to provide a local oscillator (LO) signal;
an electronic component configured to receive radio frequency (RF) signals and to use the LO signal to process the RF signals; and
a coupled transmission line configured to provide the LO signal from the local oscillator to the electronic component and disposed on multiple metallization layers separated in a direction perpendicular to a plane of each metallization layer, wherein:
the coupled transmission line comprises a plurality of individual lines extending in parallel in a direction of current flow and configured to carry current in opposite directions,
each of the plurality of individual lines of the coupled transmission line comprises a plurality of strips, and
the coupled transmission line is disposed on different metallization layers such that the individual lines on the different layers overlap each other in the perpendicular direction.
6. The transceiver of claim 5, wherein:
the strips of the coupled transmission line overlay each other on the different metallization layers,
the strips of the coupled transmission line on each metallization layer are configured to carry current in opposite directions, and
overlaying strips of the coupled transmission line on different metallization layers are configured to carry current in opposite directions.
7. The transceiver of claim 6, wherein, at a location in the direction of current flow, at least one of the strips on one of the metallization layers is routed to another of the metallization layers and the overlaying strip on the other of the metallization layers is routed to the one of the metallization layers.
8. The transceiver of claim 7, wherein, at substantially a same location in the direction of current flow, each of the strips on one of the metallization layers is routed to another of the metallization layers and the corresponding overlaying strip on the other of the metallization layers is routed to the one of the metallization layers.

Signed and Sealed this
Fourth Day of June, 2019

Andrei Iancu
*Director of the United States Patent and Trademark Office*

9. The transceiver of claim 1, wherein each of the strips extends at least several mm in the direction of current flow." and insert --5. The transceiver of claim 1, wherein each of the strips extends at least several mm in the direction of current flow.

6. A transceiver, comprising:

a local oscillator configured to provide a local oscillator (LO) signal;

an electronic component configured to receive radio frequency (RF) signals and to use the LO signal to process the RF signals; and a coupled transmission line configured to provide the LO signal from the local oscillator to the electronic component and disposed on multiple metallization layers separated in a direction perpendicular to a plane of each metallization layer, wherein:

the coupled transmission line comprises a plurality of individual lines extending in parallel in a direction of current flow and configured to carry current in opposite directions, each of the plurality of individual lines of the coupled transmission line comprises a plurality of strips, and the coupled transmission line is disposed on different metallization layers such that the individual lines on the different layers overlap each other in the perpendicular direction.

7. The transceiver of claim 6, wherein:

the strips of the coupled transmission line overlay each other on the different metallization layers, the strips of the coupled transmission line on each metallization layer are configured to carry current in opposite directions, and overlaying strips of the coupled transmission line on different metallization layers are configured to carry current in opposite directions.

8. The transceiver of claim 7, wherein, at a location in the direction of current flow, at least one of the strips on one of the metallization layers is routed to another of the metallization layers and the overlaying strip on the other of the metallization layers is routed to the one of the metallization layers.

9. The transceiver of claim 8, wherein, at substantially a same location in the direction of current flow, each of the strips on one of the metallization layers is routed to another of the metallization layers and the corresponding overlaying strip on the other of the metallization layers is routed to the one of the metallization layers.-- therefor